United States Patent [19]

Eccles

[11] Patent Number: 5,479,055
[45] Date of Patent: Dec. 26, 1995

[54] ELECTRONIC CIRCUIT ASSEMBLY AN A SUBSTRATE CONTAINING PROGRAMMABLE SWITCHES

[75] Inventor: Edward S. Eccles, Bishop's Cleeve, England

[73] Assignee: Smiths Industries Public Limited Company, London, United Kingdom

[21] Appl. No.: 136,244

[22] Filed: Oct. 15, 1993

[30] Foreign Application Priority Data

Oct. 31, 1992 [GB] United Kingdom ............... 9222840

[51] Int. Cl.⁶ ..................................................... H02J 3/14
[52] U.S. Cl. ........................................... 307/38; 340/825
[58] Field of Search ................................ 340/825, 166, 340/718, 713, 825; 350/502; 29/846

[56] References Cited

U.S. PATENT DOCUMENTS 3,940,740  2/1976  Coontz ................................. 340/166
4,698,627  10/1987  Den Boer et al. ................... 340/718
4,906,987  3/1990  Venaleck et al. .................... 340/825

Primary Examiner—William M. Shoop, Jr.
Assistant Examiner—Albert Paladini
Attorney, Agent, or Firm—Pollock, VandeSande and Priddy

[57] ABSTRACT

An electronic assembly has a substrate with several conductive tracks and with a switching matrix within the thickness of the substrate. Several groups of identical integrated circuits are mounted on the substrate, one circuit from each group being operatively connected into the assembly by the switching matrix. A processor detects malfunction of a circuit and controls the switching matrix to disconnect that circuit and operatively connect into the assembly an alternative circuit from the same group.

11 Claims, 1 Drawing Sheet

ELECTRONIC CIRCUIT ASSEMBLY AN A SUBSTRATE CONTAINING PROGRAMMABLE SWITCHES

BACKGROUND OF THE INVENTION

This invention relates to electronic assemblies.

The invention is more particularly concerned with assemblies including at least one integrated circuit device and a programmable switching unit connected to the circuit.

Integrated circuits are presently available including logic elements with switches that can be programmed so as to allow the logic to be configured into a number of different functions. The program may be fixed by the manufacturer or alterable, that is, re-programmable. These re-programmable devices are referred to as field-programmable gate arrays or FPGAs.

Either FPGAs or multiplexed interconnect chips (MICs) can be connected to printed circuit boards to make electrical connection with tracks on the board so that the tracks are interconnected with one another via the device and in a pattern that can be changed by re-programming of the gate array in the device. The printed circuit board would carry other circuit devices in the usual way.

BRIEF SUMMARY OF THE INVENTION

It is an object of the present invention to provide an improved form of electronic assembly which enables interconnect patterns with circuit devices to be re-programmed either by the manufacturer or the user.

According to the present invention there is provided an electronic assembly including a substrate having a plurality of conductive tracks and at least one electronic circuit device mounted on and electrically connected with the substrate, the substrate including within it a plurality of reprogrammable switches by which connection of the tracks with the device mounted on the substrate can be changed.

The assembly preferably includes a plurality of electronic devices only some of which are operatively connected in the assembly at any time. The assembly preferably includes means for detecting malfunction of the devices. Some at least of the electronic devices are preferably identical with one another, the means for detecting malfunction controlling operation of the switches to disconnect a malfunctioning device and to switch an alternative device into operative connection. The assembly may include several groups of identical devices, the devices of one group differing in nature from the devices of another group. The number of identical devices within a group may differ from group to group according to the relative reliability of the devices or how critical the devices are to operation of the assembly. The assembly may include a memory arranged to store information as to which devices are operatively connected into the assembly and as to any devices that have been previously operatively disconnected from the assembly. The assembly may include a plurality of devices that perform different functions, a plurality of devices of identical construction, means for programming the devices of identical construction to perform different functions so that they can be operatively connected into the assembly to replace the said devices that perform different functions. The switching devices may be located in the substrate beneath the devices.

An electronic assembly according to the present invention, will now be described, by way of example, with reference to the accompanying drawing.

DETAILED DESCRIPTION OF THE PREFERRED EMBODIMENTS

Figure 1:
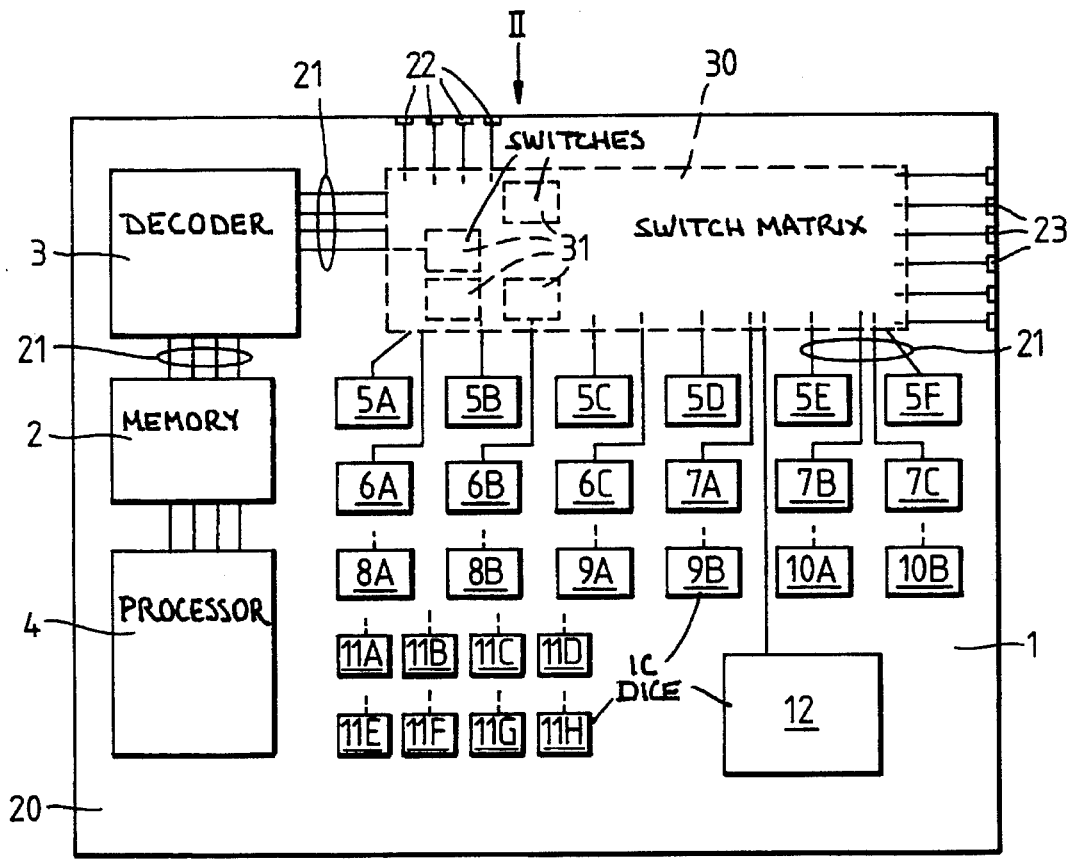
FIG. 1 is a plan view of the assembly.
Figure 2:
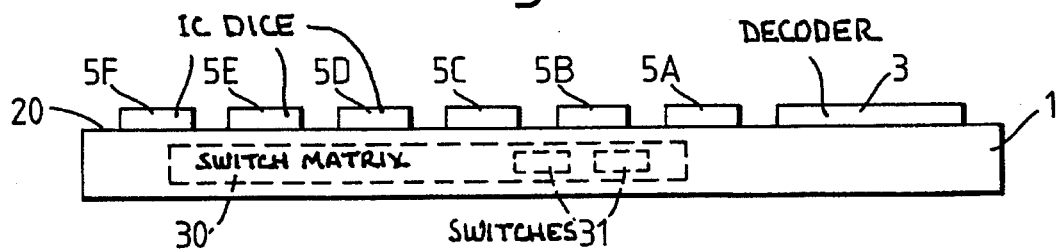
FIG. 2 is a side view of the assembly along the arrow II of FIG. 1.

The assembly comprises a rectangular silicon substrate 1 on which are mounted thirty integrated circuit dice 2 to 4, 5A to 5F, 6A to 6C, 7A to 7C, 8A, 8B, 9A, 9B, 10A, 10B, 11A to 11H and 12 only some of which are operatively connected in the assembly at any time.

The silicon substrate 1 has a larger surface area than any of the individual integrated circuit dice and carries on its upper surface 20 a number of electrically-conductive tracks 21, formed of a plated or deposited metal, which serve electrically to connect different ones of the dice with each other and with input and output connections 22 and 23 to and from the assembly. The substrate also includes within its thickness, a programmable switching unit or switch matrix 30. The switch matrix is formed by conventional deposition, doping and etching techniques to produce a number of active semiconductor devices, which function as conventional logic gate arrays or switches 31. The individual switches 31 within the matrix are connected to respective ones of the dice 5A to 5F, 6A to 6C, 7A to 7C, 8A, 8B, 9A, 9B, 10A, 10B, 11A to 11H and 12 and serve to connect different ones of the dice operatively in the assembly. For simplicity, not all of the interconnect tracks between the dice and the switch matrix 30 have been shown on the drawing.

The example illustrated is of a fault tolerant system carrying spare capacity that is switched into the assembly when a failure is detected, the faulty dice being switched out of the assembly. The die 2 is a memory element storing data applied to a decoder die 3, which in turn determines which of the switches in the matrix 30 are open or closed to route signals, power or any other interconnections between the various dice in use. The dice 5 A to 5F are in a group of six identical dice only one of which is connected operatively into the assembly at any time via the matrix 30. The dice 6A to 6C and 7A to 7C are two groups replicated in the same way, in triplicate, whereas the dice 8A and 8B, 9A and 9B, and 10A and 10B are duplicated. The dice 11A to 11H are present in a group of eight identical devices. The dice in the different groups differ from one another as to their nature; they also differ as to relative reliability and, or alternatively, the degree to which their operation is critical to operation of the assembly. Die 11 is either the most critical or the most prone to failure and is, therefore, replicated to the greatest extent. The die 12 is either the least critical or the most reliable and it is not, therefore, replicated. The operation of the different dice is monitored by a processor 4, which is shown as being mounted on the substrate 1 but which could be separate from the assembly. The processor 4 need not be directly connected with the different dice since it might be possible in some assemblies to identify a malfunctioning die by monitoring the output signals, for example, at the connections 23. When the processor 4 detects a malfunction, it signals this to the memory element 2 in which is stored information about the dice currently operatively connected in the assembly, any dice previously disconnected, and the next dice to be used as a replacement. It signals this to the decoder element 3, which effects the appropriate switching of the gates forming the switches 31 in the matrix 30, to disconnect the faulty die and to switch a replacement die into operative connection.

As illustrated, for clarity, the switching matrix 30 is located in a different region of the substrate 1 from that occupied by the dice. In practice, however, the switching matrix preferably extends, at least in part beneath the dice.

A saving in the number of dice used could be achieved if the dice were all of the same physical construction and were appropriately programmed to perform their particular tasks. In this way, the processor 4 could be used to program any one of the spare dice to perform the function of a die that was malfunctioning.

The assembly of the present invention is not confined for use in automatically switching redundant dice into and out of circuit but it could be used for other applications. For example, one assembly might be used for several different applications by appropriately addressing the switch matrix so that the desired dice are switched into operative connection and the unwanted dice are disconnected. This could produce savings where it is cheaper to produce a large number of identical assemblies with some unwanted dice on each, than to produce smaller numbers of assemblies in which all the dice on the assemblies are used.

By incorporating the switching matrix into the substrate on which the dice are mounted, a saving on space and interconnections can be achieved and reliability can be improved.

The assembly described could itself be mounted on another substrate incorporating a similar switching matrix that is used to achieve switching between different assemblies.

What I claim is:

1. An electronic assembly comprising: a substrate, said substrate having a plurality of conductive tracks; a plurality of electronic circuit devices; means mounting the electronic devices on the substrate in electrical connection therewith; a memory storing information as to which devices are operatively connected into the assembly; and a plurality of reprogrammable switches within the substrate by which connection of said devices with the tracks can be changed.

2. An electronic assembly according to claim 1, wherein only some of the devices are operatively connected in the assembly at any time.

3. An electronic assembly according to claim 1, including a processor connected to detect malfunction of the devices.

4. An electronic assembly according to claim 3, wherein some at least of the electronic devices are identical with one another, and wherein said processor controls operation of the switches to disconnect a malfunctioning device and to switch an alternative device into operative connection.

5. An electronic assembly according to claim 4, wherein the assembly includes several groups of devices, wherein the devices within a group are identical to one another, and wherein the devices of one group differ in function from the devices of another group.

6. An electronic assembly according to claim 5, wherein the number of identical devices within a group differs from group to group according to the relative reliability of the devices.

7. An electronic assembly according to claim 5, wherein the number of identical devices within a group differs from group to group according to how critical the devices are to operation of the assembly.

8. An electronic assembly according to claim 1, wherein said memory stores information as to any devices that have been previously operatively disconnected from the assembly.

9. An electronic assembly according to claim 3, wherein the assembly includes a plurality of devices that perform different functions, a plurality of devices of identical construction, and a processor operates to program the devices of identical construction to perform different functions so that they can be operatively connected into the assembly to replace the said devices that perform different functions.

10. An electronic assembly according to any one of claims 1, 2–7, 8 and 9, wherein the switches comprise a switching matrix located in a region of the substrate that extends at least partially beneath the devices.

11. An electronic assembly comprising: a substrate having a plurality of conductive tracks; a plurality of groups of electronic devices, the devices in a group being identical with one another; means mounting the electronic devices on the substrate; a plurality of reprogrammable switches within the substrate by which one of the devices in each group is connected via the tracks into operative connection in the assembly; a memory storing information as to which of said devices are operatively connected into the assembly and which of said devices have previously been operatively disconnected from the assembly; and a processor responsive to a malfunction of a device to reprogram the switches to connect an alternative device from the same group, not previously disconnected, into operative connection.

* * * * *